(12) United States Patent
Yang et al.

(10) Patent No.: US 10,068,937 B2
(45) Date of Patent: Sep. 4, 2018

(54) IMAGE SENSOR AND METHOD FOR FABRICATING THE SAME

(71) Applicant: SK hynix Inc., Gyeonggi-do (KR)

(72) Inventors: Yun-Hui Yang, Gyeonggi-do (KR);
Sung-Kun Park, Gyeonggi-do (KR);
Pyong-Su Kwag, Gyeonggi-do (KR);
Ho-Ryeong Lee, Gyeonggi-do (KR);
Young-Jun Kwon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 6 days.

(21) Appl. No.: 15/214,012

(22) Filed: Jul. 19, 2016

(65) Prior Publication Data

US 2017/0278884 A1 Sep. 28, 2017

(30) Foreign Application Priority Data

Mar. 22, 2016 (KR) .................. 10-2016-0034041

(51) Int. Cl.
*H01L 27/146* (2006.01)
*H01L 29/10* (2006.01)
(Continued)

(52) U.S. Cl.
CPC .. *H01L 27/14616* (2013.01); *H01L 21/28114* (2013.01); *H01L 21/823412* (2013.01); *H01L 21/823456* (2013.01); *H01L 21/823487* (2013.01); *H01L 27/14614* (2013.01); *H01L 27/14638* (2013.01); *H01L 27/14643* (2013.01);
(Continued)

(58) Field of Classification Search
CPC ........... H01L 27/14616; H01L 27/1464; H01L 27/14692; H01L 27/14643; H01L 29/1037; H01L 29/66787; H01L 29/78696; H01L 29/7853; H01L 29/0676; H01L 29/78675; H01L 29/785; H01L 29/66795; H01L 21/28114; H01L 21/823412; H01L 21/823437; H01L 21/823456; H01L 21/823487; H01L 21/823807; H01L 21/823828; H01L 21/82385; H01L 21/823885; H01L 27/14612; H01L 27/14614; H01L 27/14638; H01L 27/14641; H01L 27/14689; H01L 29/42376; H01L 29/42384; H01L 29/66666; H01L 29/6675; H01L 29/7827; H01L 29/78642; H01L 29/78672
See application file for complete search history.

(56) References Cited

U.S. PATENT DOCUMENTS 7,279,735 B1 * 10/2007 Yu ..................... H01L 21/28273
257/315
8,669,601 B2 * 3/2014 Masuoka ................ H01L 21/84
257/291
(Continued)

FOREIGN PATENT DOCUMENTS

KR 101105432 1/2012

*Primary Examiner* — Yu Chen
(74) *Attorney, Agent, or Firm* — IP & T Group LLP

(57) ABSTRACT

This technology relates to an image sensor. The image sensor may include a substrate including a photoelectric conversion element; a pillar formed over the photoelectric conversion element and having a concave-convex sidewall; a channel film formed along a surface of the pillar and for having at least one end coupled to the photoelectric conversion element; and a transfer gate formed over the channel film.

30 Claims, 10 Drawing Sheets

(51) Int. Cl.
*H01L 29/66* (2006.01)
*H01L 21/8234* (2006.01)
*H01L 21/28* (2006.01)
*H01L 29/786* (2006.01)
*H01L 29/423* (2006.01)

(52) U.S. Cl.
CPC .. *H01L 27/14689* (2013.01); *H01L 27/14692* (2013.01); *H01L 29/1037* (2013.01); *H01L 29/66666* (2013.01); *H01L 29/66787* (2013.01); *H01L 29/78642* (2013.01); *H01L 29/78696* (2013.01); *H01L 27/1464* (2013.01); *H01L 27/14605* (2013.01); *H01L 27/14641* (2013.01); *H01L 29/42376* (2013.01); *H01L 29/42384* (2013.01); *H01L 29/6675* (2013.01); *H01L 29/78672* (2013.01)

(56) References Cited

U.S. PATENT DOCUMENTS

| | | | |
|---|---|---|---|
| 9,520,427 B1* | 12/2016 | Yoo | H01L 27/14614 |
| 9,620,540 B1* | 4/2017 | Yang | H01L 27/14616 |
| 2008/0230832 A1* | 9/2008 | Cho | H01L 29/66795 |
| | | | 257/327 |
| 2013/0062673 A1* | 3/2013 | Masuoka | H01L 27/14614 |
| | | | 257/291 |
| 2014/0211056 A1* | 7/2014 | Fan | H01L 27/14643 |
| | | | 348/308 |
| 2015/0029374 A1 | 1/2015 | Kitano | |
| 2015/0243734 A1* | 8/2015 | Pandey | H01L 29/0692 |
| | | | 438/283 |
| 2015/0311200 A1* | 10/2015 | Yin | H01L 29/66795 |
| | | | 257/401 |
| 2016/0056201 A1* | 2/2016 | Yamashita | H01L 27/14654 |
| | | | 257/292 |

* cited by examiner

IMAGE SENSOR AND METHOD FOR FABRICATING THE SAME

CROSS-REFERENCE TO RELATED APPLICATIONS

The present application claims priority to Korean Patent Application No. 10-2016-0034041, filed on Mar. 22, 2016, which is herein incorporated by reference in its entirety.

BACKGROUND

Exemplary embodiments of the present invention relate to a semiconductor device manufacturing technology, and more particularly, to an image sensor and a method for fabricating the same.

An image sensor converts an optical image into an electrical signal. Recently, due to a development in a computer industry and a communication industry, a demand for an image sensor with improved performance has increased for various devices, such as digital cameras, camcorders, Personal Communication Systems (PCS), game machines, security cameras, medical micro-cameras, and robots.

SUMMARY

Various embodiments are directed to the provision of an image sensor having improved performance.

In an embodiment, an image sensor may include a substrate including a photoelectric conversion element; a pillar formed over the photoelectric conversion element and having a concave-convex sidewall; a channel film formed along a surface of the pillar and for having at least one end coupled to the photoelectric conversion element; and a transfer gate formed over the channel film.

The pillar may include a stack structure in which a first insulating layer and a second insulating layer are alternately stacked N number of times, wherein N is a positive integer. The first insulating layer and the second insulating layer may have different etch selectivity from each other. An uppermost layer of the stack structure may be formed of the first insulating layer, and wherein a lowermost layer of the stack structure may be formed of the first insulating layer. A thickness of the second insulating layer may be greater than a thickness of the first insulating layer. A line width of the second insulating layer may be smaller than a line width of the first insulating layer. The first insulating layer may include oxide. The second insulating layer may include nitride.

The channel film may include polysilicon. The channel film may include undoped polysilicon or P type polysilicon. The channel film may include N type polysilicon. The transfer gate may include an open portion exposing part of the channel film.

In an embodiment, an image sensor may include an active region and a photoelectric conversion element provided in a substrate; an isolation structure formed in the substrate and between the active region and the photoelectric conversion element; a first pillar formed over the photoelectric conversion element and having a concave-convex sidewall; a first channel film formed along a surface of the first pillar and for having at least one end coupled to the photoelectric conversion element; a first gate formed over the first channel film; a second pillar formed over the active region; a source region and a drain region formed in the active region so that the second pillar is located between the source region and the drain region; a second channel film formed along a surface of the second pillar and having ends on both sides of the second channel film coupled to the source region and the drain region, respectively; and a second gate formed over the second channel film.

Each of the first pillar and the second pillar may include a stack structure in which a first insulating layer and a second insulating layer are alternately stacked N number of times, wherein N is a positive integer. The first insulating layer and the second insulating layer may have different etch selectivity from each other. An uppermost layer of the stack structure may be formed of the first insulating layer, and wherein a lowermost layer of the stack structure may be formed of the first insulating layer. A thickness of the second insulating layer may be greater than a thickness of the first insulating layer. In the stack structure of the first pillar, a line width of the second insulating layer may be smaller than a line width of the first insulating layer. The first insulating layer may include oxide. The second insulating layer may include nitride.

The first pillar and the second pillar may be the same as each other in vertical length. The second pillar may have a vertical sidewall. The second pillar may have a concave-convex sidewall. Each of the first channel film and the second channel film may include polysilicon. The first channel film may include undoped polysilicon or P type polysilicon. The first channel film may include N type polysilicon. The second channel film may include P type polysilicon. The first gate may include an open portion exposing part of the first channel film. The first gate may include a transfer gate. The second gate may include a reset gate, a source follower gate, or a selection gate.

In an embodiment, a method for fabricating an image sensor may include forming a multi-layer film over a substrate, wherein the multi-layer film includes a first insulating layer and a second insulating layer which are alternately stacked N number of times, wherein a photoelectric conversion element is provided in the substrate and under the multi-layer film; forming a pillar having a vertical sidewall by etching the multi-layer film; patterning the second insulating layer so that the pillar has a concave-convex sidewall; forming a channel film along a surface of the structure comprising the pillar; and forming a transfer gate over the channel film. Moreover, the method may further include forming an open portion in the transfer gate and exposing part of the channel film.

In an embodiment, a method for fabricating an image sensor may include forming an active region and a photoelectric conversion element in a substrate;

forming an isolation structure in the substrate and between the active region and the photoelectric conversion element; forming a multi-layer film over the substrate, wherein the multi-layer film includes a first insulating layer and a second insulating layer which are alternately stacked N number of times, wherein N is a positive integer; etching the multi-layer film to form a first pillar and a second pillar over the photoelectric conversion element and the active region, respectively, wherein each of the first pillar and the second pillar has a vertical sidewall; etching the second insulating layer in the first pillar so that the first pillar has a concave-convex sidewall; forming a reserved channel film along a surface of a structure comprising the first pillar and the second pillar; forming a gate insulating layer over the reserved channel film; forming a gate conductive film over the gate insulating layer; patterning the gate conductive film to form a first gate and a second gate, wherein the first gate is formed over the concave-convex sidewall of the first pillar, wherein the second gate is formed over the vertical sidewall of the second pillar; patterning the reserved channel film to form a first channel film and a second channel film, wherein the first channel film is formed between the concave-convex sidewall of the first pillar and the first gate, wherein the second channel film is formed between the vertical sidewall of the second pillar and the second gate; and patterning the gate insulating layer to form first and second gate insulating patterns, wherein the first gate insulating pattern is formed between the first channel film and the first gate, wherein the second gate insulating pattern is formed between the second channel film and the second gate. Furthermore, the method may further include forming an open portion in the first gate and exposing part of the first channel film. Furthermore, the method may further include doping first and second impurities into the reserved channel film formed over the photoelectric conversion element and the reserved channel film formed over the active region, respectively, after the forming of the reserved channel film.

DETAILED DESCRIPTION

Figure 1:
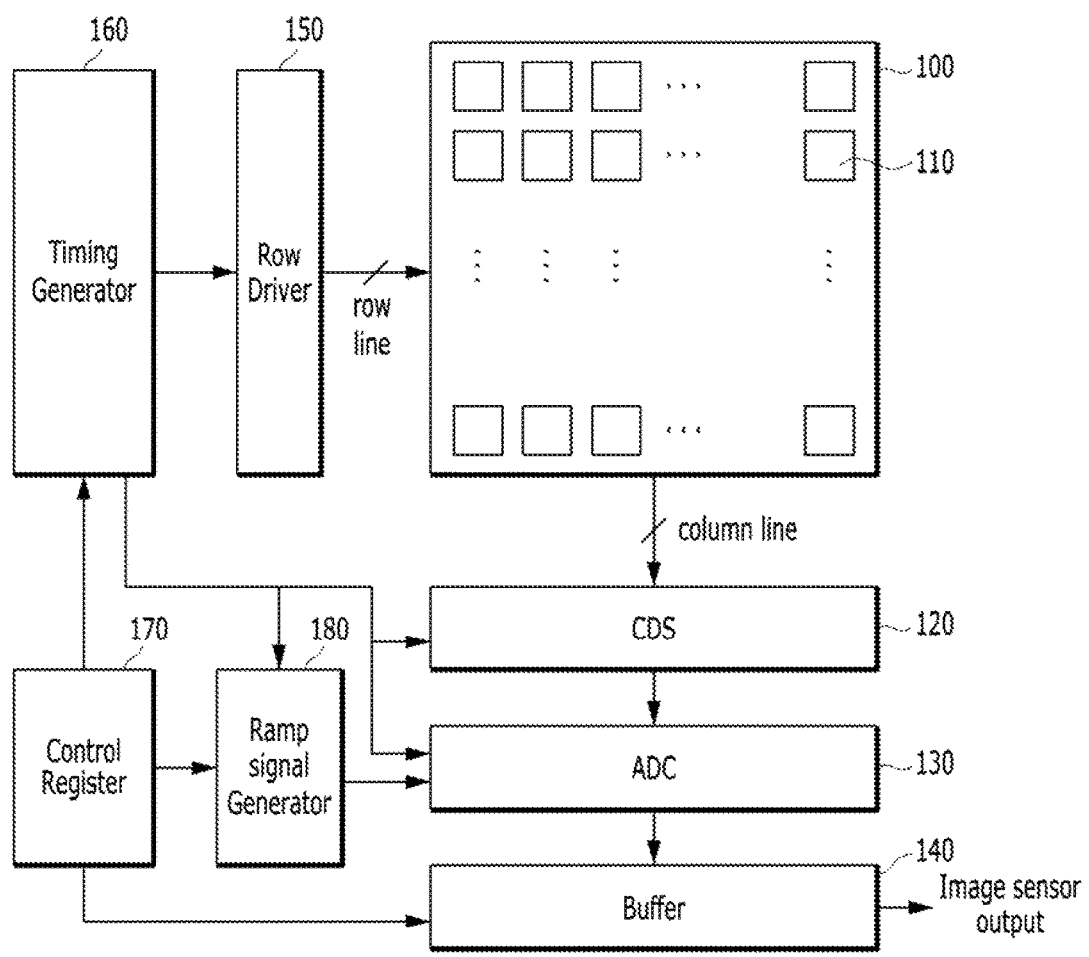
FIG. 1 is a block diagram schematically illustrating an image sensor in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

Embodiments of the present invention to be described herein provide an image sensor having improved performance and a method for fabricating the same. In this case, the image sensor having improved performance may mean an image sensor capable of providing a high-pixel image. In order to provide a high-pixel image, there is a need for an image sensor in which a maximum number of unit pixels have been integrated within a limited area. Accordingly, in an image sensor in accordance with an embodiment, each of a plurality of unit pixels may include a transfer transistor having a vertical transfer gate and may have a structure in which the transfer transistor and a photoelectric conversion element have been stacked.

FIG. 1 is a block diagram schematically illustrating an image sensor in accordance with an embodiment of the present invention. As illustrated in FIG. 1, the image sensor may include a pixel array 100, a correlated double sampling (CDS) unit 120, an analog-digital converter (ADC) 130, a buffer 140, a row driver 150, a timing generator 160, a control register 170, and a ramp signal generator 180. The pixel array 100 may include a plurality of unit pixels 110 arranged in a matrix.

The timing generator 160 may generate one or more control signals for controlling the row driver 150, the CDS unit 120, the ADC 130, and the ramp signal generator 180. The control register 170 may generate one or more control signals for controlling the ramp signal generator 180, the timing generator 160, and the buffer 140.

The row driver 150 may drive the pixel array 100 row by row. For example, the row driver 150 may generate a select signal for selecting any one row line among a plurality of row lines. Each of the unit pixels 110 may sense incident light and output an image reset signal and an image signal to the CDS unit 120 through a column line. The CDS unit 120 may perform sampling in response to the image reset signal and the image signal.

The ADC 130 may compare a ramp signal outputted from the ramp signal generator 180 with a sampling signal outputted from the CDS unit 120, and output a comparison signal. According to a clock signal provided from the timing generator 160, the ADC 130 may count the level transition time of the comparison signal, and output a count value to the buffer 140. The ramp signal generator 180 may operate under control of the timing generator 160.

The buffer 140 may store a plurality of digital signals outputted from the ADC 130, then sense and amplify the digital signals. The buffer 140 may include a memory (not illustrated) and a sense amplifier (not illustrated). The memory may store count values. The count values may represent signals outputted from the plurality of unit pixels 110. The sense amplifier may sense and amplify the count values outputted from the memory.

To provide a high-pixel image, the number of unit pixels 110 integrated within the pixel array 100 has to increase. That is, more unit pixels 110 need to be integrated within a limited area. Therefore, the physical size of the unit pixel 110 needs to be reduced. However, if the physical size of the unit pixel 110 is reduced, the characteristics of the unit pixel 100 are inevitably deteriorated since the image sensor operates based on a pixel signal generated by each unit pixel in response to incident light.

Accordingly, to prevent the characteristics of the unit pixel 100 from being deteriorated due to a high degree of integration, there has been proposed a three-dimensional pixel including a transistor having a vertical channel capable of maximizing the fill factor of the photoelectric conversion element. In the three-dimensional pixel, a required channel length is secured by increasing the height of the channel, but it is difficult to secure the required channel length since the height is cannot be unlimitedly increased. Accordingly, the characteristics of the unit pixel are deteriorated due to a short channel effect. Furthermore, it is difficult to provide various channel lengths for transistors having different functions.

Accordingly, in the following embodiments of the present invention, an image sensor capable of a high degree of integration, preventing the deterioration of characteristics attributable to an increase of the degree of integration, and providing various channel lengths for transistors having different functions is described in detail with reference to the accompanying drawings.

Figure 2:
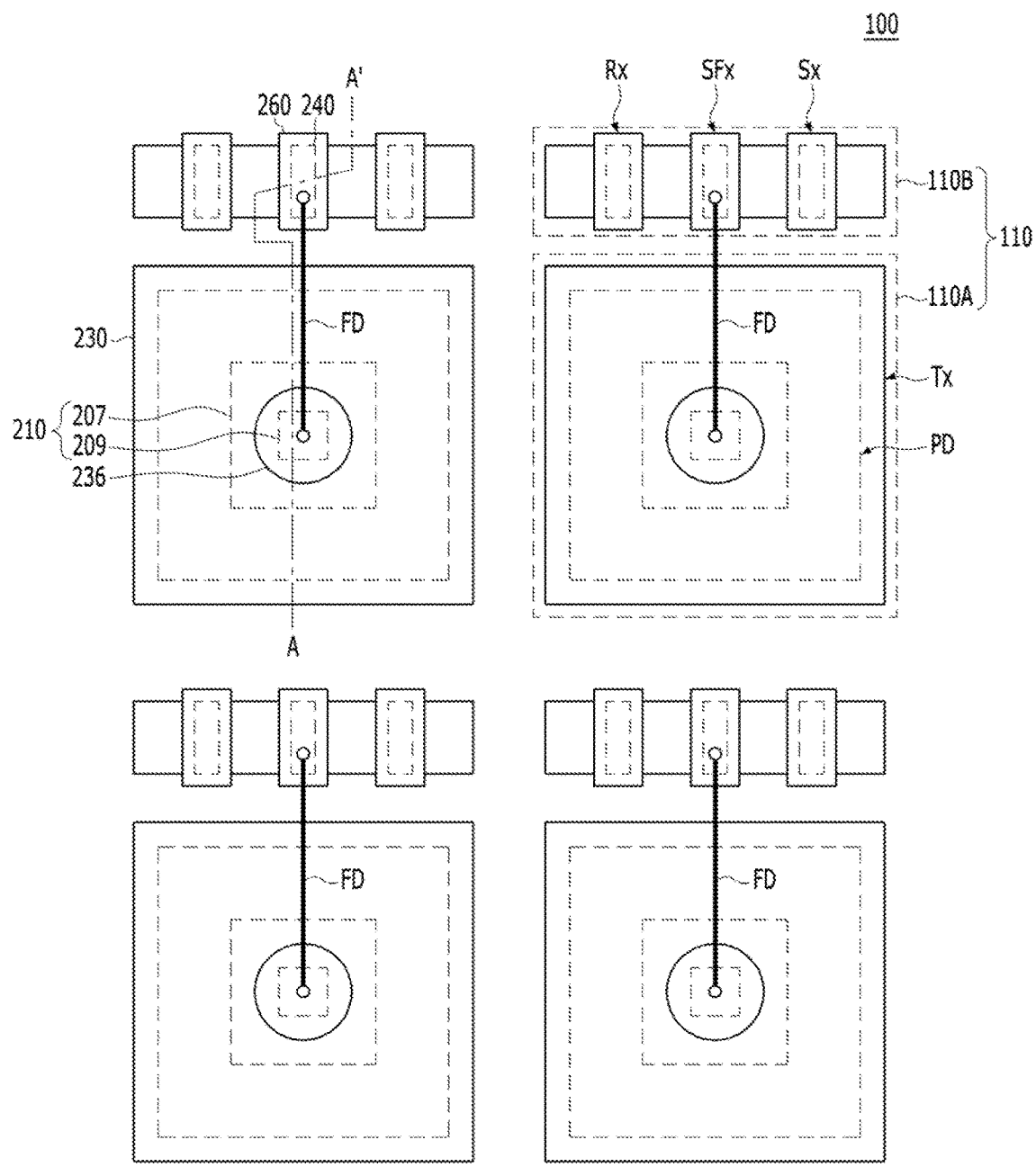
FIG. 2 is a plane view illustrating part of a pixel array of an image sensor in accordance with an embodiment of the present invention.
Figure 3:
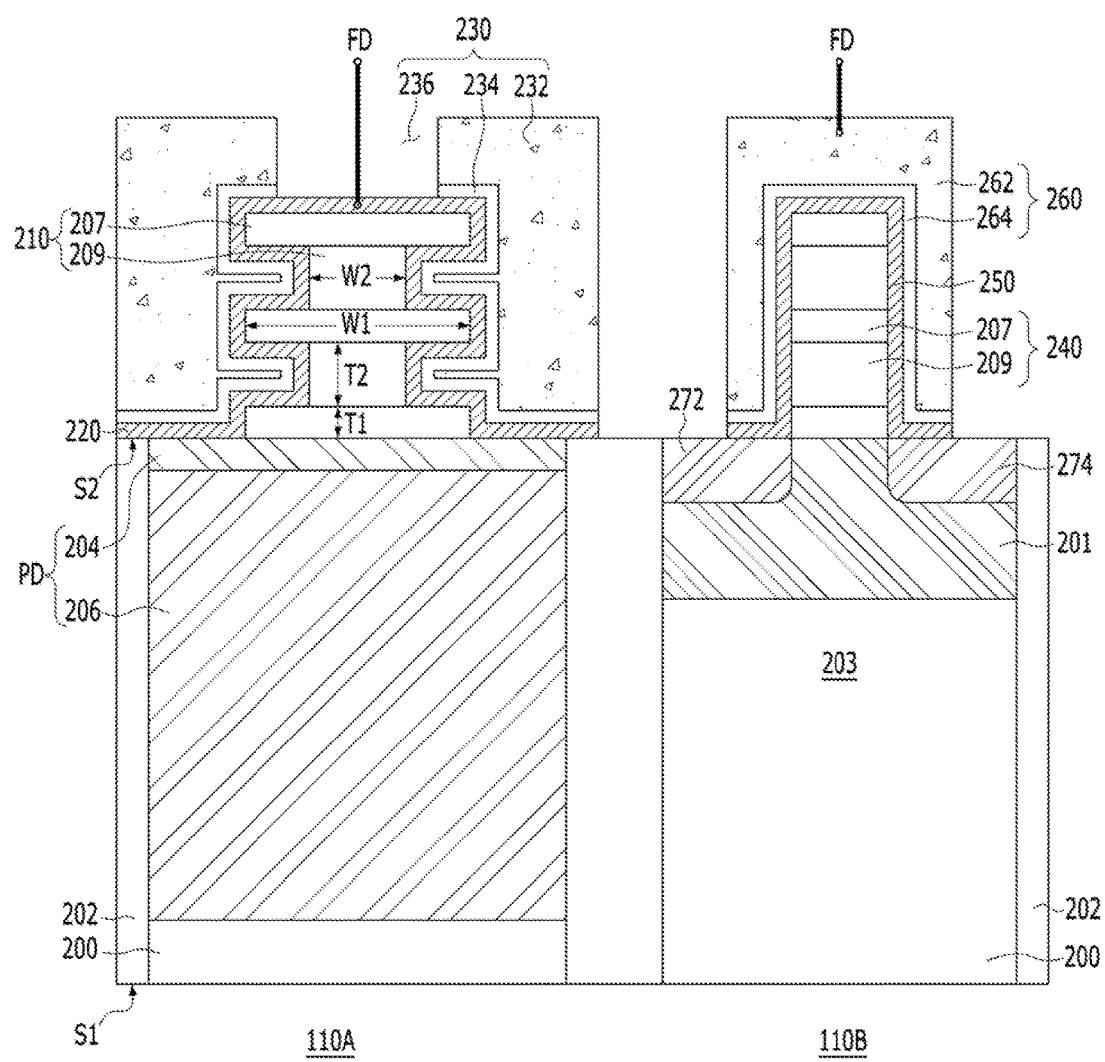
FIG. 3 is a cross-sectional view taken along the line A-A' of FIG. 2.

FIG. 2 is a plane view illustrating part of the pixel array of an image sensor in accordance with an embodiment of the present invention. FIG. 3 is a cross-sectional view taken along the line A-A' of FIG. 2.

As shown in FIG. 2, the image sensor in accordance with an embodiment includes the pixel array 100. The pixel array 100 may include a plurality of unit pixels 110. Each of the plurality of unit pixels 110 may include a light-receiving unit 110A, including a photoelectric conversion element PD and a transfer transistor Tx, and an output unit 110B including a reset transistor Rx, a source follower transistor SFx, and a selection transistor Sx. FIG. 3 shows the source follower transistor SFx of the output unit 110B.

In an image sensor in accordance with an embodiment, the plurality of unit pixels 110 may be separated from each other by an isolation structure 202 formed in a substrate 200. Furthermore, the light-receiving unit 110A and output unit 110B of each of the plurality of unit pixels 110 may be separated from each other by the isolation structure 202. Furthermore, the active region 203 of the output unit 110B may be defined by the isolation structure 202.

The substrate 200 may include a semiconductor substrate. The semiconductor substrate may be a single crystal state and may include a silicon-containing material. That is, the substrate 200 may include a single crystal silicon-containing material. Furthermore, the substrate 200 may be a substrate thinned through a thinning process. For example, the substrate 200 may be a bulk silicon substrate thinned through a thinning process.

The isolation structure 202 may include a shallow trench isolation (STI), a deep trench isolation (DTI) or an impurity region. The impurity region may have been formed by implanting or doping impurities into the substrate 200. For example, the impurity region may be a P type impurity region formed by implanting or doping boron (B), that is, P type impurities, into the substrate 200. The isolation structure 202 may include any one of the STI, the DTI, and the impurity region or may include a combination of two or more of the STI, the DTI, and the impurity region. For example, the isolation structure 202 surrounding the photoelectric conversion element PD may be a DTI or may have a form in which a DTI and an impurity region have been combined. Furthermore, the isolation structure 202 surrounding the active region 203 may be an impurity region or may have a form in which an impurity region and an STI have been combined.

In an image sensor in accordance with an embodiment, the light-receiving unit 110A may include the substrate 200 configured to have the photoelectric conversion element PD, a first pillar 210 formed on the photoelectric conversion element PD and configured to have a sidewall having a concave-convex structure, a first channel film 220 formed on a surface of the first pillar 210 and configured to have an end coupled to the photoelectric conversion element PD, and a first gate 230 formed on the first channel film 220. In this case, the first gate 230 may serve as a transfer gate of the transfer transistor Tx.

The photoelectric conversion element PD may include an organic or inorganic photodiode. For example, the photoelectric conversion element PD formed in the substrate 200, and may have a first impurity region 204 and a second impurity region 206 which have complementary conductive types to each other. The first impurity region 204 may be a P type impurity region. The first impurity region 204 may be formed in a surface of the substrate 200. The second impurity region 206 may be an N type impurity region, may be disposed between the first impurity region 204 and the substrate 200, and may overlap the first impurity region 204.

When viewed along the vertical direction, the second impurity region 206 may have a uniform doping profile or a profile in which an impurity doping concentration increases in a charge movement direction. The surface of the substrate 200 may be an opposite plane S2 that is opposite to an incident plane S1. Incident light enters into the photoelectric conversion element PD through the incident plane S1. Furthermore, the charge movement direction is the direction heading from the incident plane S1 toward the opposite plane S2.

The first pillar 210 has a sidewall in a concave-convex structure to increase a channel length for the transfer transistor Tx. In this case, the first pillar 210 can effectively increase a channel length for the transfer transistor Tx even without increasing a vertical length of the first pillar 210. The first pillar 210 may be a polygon, circle, ellipse, etc. in a plane view.

The first pillar 210 may include an insulating material. Specifically, the first pillar 210 may be formed by alternately stacking insulating layers having different etch selectivities from each other several times. The first pillar 210 may have a stack structure in which a first insulating layer 207 including oxide and a second insulating layer 209 including nitride have been alternately stacked several times.

The bottom layer and top layer of the first pillar 210 may be the first insulating layer 207. This is for preventing characteristics from being deteriorated due to the physical properties of the second insulating layer 209 including nitride. The thickness T1 of the first insulating layer 207 may be smaller than the thickness T2 of the second insulating layer 209 to facilitate a process for forming the first channel film 220. Furthermore, the line width W1 of the first insulating layer 207 may be greater than the line width W2 of the second insulating layer 209. As a difference between the line width W1 of the first insulating layer 207 and the line width W2 of the second insulating layer 209 increases, the channel length of the transfer transistor Tx may increase.

The first pillar 210 whose sidewall has a concave-convex structure may be placed over the central part of the photoelectric conversion element PD. Under this structure, photocharges generated by the photoelectric conversion element PD can be transmitted to the first channel film 220 more efficiently. In an embodiment, the single first pillar 210 is formed on the photoelectric conversion element PD. In another embodiment, two or more first pillars 210 may be formed on the photoelectric conversion element PD. If two or more first pillars 210 are formed on the photoelectric conversion element PD, the plurality of first pillars 210 may be disposed in a matrix form at the same level.

The first channel film 220 may function to transfer photocharges generated by the photoelectric conversion element PD to a floating diffusion FD in response to a transfer signal applied to the first gate 230, that is, a transfer gate. The first channel film 220 may have a constant thickness along the surface of the first pillar 210. The first channel film 220 formed along the surface of the first pillar 210. To increase a contact area between the photoelectric conversion element PD and the first channel film 220, the end of the first channel film 220 which contacts the photoelectric conversion element PD may be extended over the photoelectric conversion element PD. That is, a lower end of the first channel film 220 may extend between the first gate 230 and the photoelectric conversion element PD and more specifically, may be in between the first gate 230 and the first impurity region 204 of the photoelectric conversion element PD.

The first channel film 220 may include a silicon-containing material. For example, the first channel film 220 may include polysilicon. Specifically, the first channel film 220 may include any one of undoped polysilicon, P type polysilicon, and N type polysilicon. When the first channel film 220 includes undoped polysilicon or P type polysilicon, the transfer transistor Tx may operate in an enhancement mode in which a channel maintains an inactivated state in an off state. In contrast, if the first channel film 220 includes N type polysilicon, the transfer transistor Tx may operate in a depletion mode in which a channel maintains an activated state in an off state.

For reference, when the first channel film 220 includes polysilicon, trap sites within the film may be a dark current generation source since polysilicon is a material having a plurality of trap sites. The image sensor in accordance with an embodiment can prevent a dark current from being generated due to the polysilicon forming of the first channel film 220. Specifically, when the first channel film 220 includes undoped polysilicon or P type polysilicon, and a negative base is applied to the first gate 230 of the transfer gate, holes may be accumulated within the first channel film 220 and at an interface between the photoelectric conversion element PD and the first channel film 220 while the transfer transistor Tx is turned off, thereby preventing the generation of a dark current. That is, the dark current, which is generated in polysilicon, can be removed by a recombination of the holes accumulated at the interface.

In contrast, when the first channel film 220 includes N type polysilicon, the transfer transistor Tx operates in a depletion mode. Accordingly, when the transfer transistor Tx is turned off, for example, during an integration time, a dark current generated within the first channel film 220 and at the interface between the photoelectric conversion element PD and the first channel film 220 can be transmitted to the outside through the floating diffusion FD. In this case, when the first channel film 220 includes N type polysilicon, a dark current can be effectively prevented compared to the case in which the first channel film 220 includes undoped polysilicon or P type polysilicon since a dark current generated within the first channel film 220 and on a surface of the substrate 200 is directed away to the outside.

The first gate 230 may be the transfer gate of the transfer transistor Tx. The first gate 230 is formed on the photoelectric conversion element PD, and may be configured to surround the sidewall of the first pillar 210. The first gate 230 may have a flat panel form and overlap the photoelectric conversion element PD. In this case, the first gate 230 may function as a rear reflection layer for the photoelectric conversion element PD since it is formed on the opposite plane S2 of the substrate 200. Accordingly, quantum efficiency of the photoelectric conversion element PD can be improved.

The first gate 230 may include an open portion 236 overlapping part of the first pillar 210. The open portion 236 is for a contact between the floating diffusion FD and the first channel film 220 formed on the top surface of the first pillar 210. The open portion 236 may be a polygon, circle, or ellipse, etc. in a plane view.

The first gate 230 may include a first gate insulating layer 234 and a first gate electrode 232. The first gate insulating layer 234 is formed on the first channel film 220 and may have a uniform thickness. The first gate insulating layer 234 may include oxide, nitride, oxynitride, or a combination thereof. The first gate electrode 232 may include a silicon-containing semiconductor material or metallic material.

In the image sensor in accordance with an embodiment, the output unit 110B may include the active region 203 defined by the isolation structure 202, a second pillar 240 formed on the active region 203, a source region 272 and a drain region 274 formed in the active region 203 on both sides of the second pillar 240, a second channel film 250 formed along a surface of the second pillar 240 and extending over the source region 272 and the drain region 274, and a second gate 260 formed on the second channel film 250. In an embodiment, the second gate 260 serves as a gate of the source follower transistor SFx. However, in another embodiment, the second gate 260 may serve as a gate of the reset transistor Rx or a gate of the selection transistor Sx. Furthermore, the substrate 200 of the active region 203 may include a well 201. The source region 272 and the drain region 274 may be placed within the well 201. The well 201 may be formed by implanting or doping P type impurities into the substrate 200.

The second pillar 240 is for providing a channel length for the source follower transistor SFx. The second pillar 240 may be formed along with the first pillar 210 and may have the same height as the first pillar 210. Accordingly, the second pillar 240 may include an insulating material and may have a stack structure in which the first insulating layer 207 including oxide and the second insulating layer 209 including nitride are alternately stacked several times.

The bottom layer and top layer of the second pillar 240 may be the first insulating layer 207. The thickness T2 of the second insulating layer 209 may be greater than the thickness T1 of the first insulating layer 207. The second pillar 240 may have a vertical sidewall or may have a sidewall having a concave-convex structure like the first pillar 210. This is for providing an increased channel length for each of the transistors of the output unit 110B. That is, the second pillar 240 can adjust a channel length as desired by changing a sidewall profile. The second pillar 240 may be a polygon, circle, ellipse, etc. in a plane view.

The source region 272 and the drain region 274 may be impurity regions formed by implanting or doping N type impurities into the substrate 200 of the active region 203. A power supply voltage may be applied to the source region 272 by the reset transistor Rx and the source follower transistor SFx. The source follower transistor SFx and the selection transistor Sx may be coupled to each other through the drain region 274.

The second channel film 250 may have a constant thickness along a surface of the second pillar 240. The second channel film 250 formed along the surface of the second pillar 240.

The second channel film 250 may include a silicon-containing material. For example, the second channel film 250 may include polysilicon. Specifically, the second channel film 250 may include P type polysilicon.

The second gate 260 formed on the second channel film 250 and the side and top surface of the second pillar 240 may overlap part of the source region 272 and the drain region 274. The second gate 260 may include a second gate insulating layer 264 and a second gate electrode 262. The second gate insulating layer 264 is formed on the second channel film 250 and may have a uniform thickness. The second gate insulating layer 264 may be formed along with the first gate insulating layer 234 and may include the same material as the first gate insulating layer 234. The second gate insulating layer 264 may include oxide, nitride, oxynitride, or a combination thereof.

The second gate electrode 262 may be formed along with the first gate electrode 232 and may include the same material as the first gate electrode 232. The second gate electrode 262 may include a silicon-containing semiconductor material, metallic material, or a combination thereof.

Although not shown, the image sensor in accordance with an embodiment may include a color separation element formed on the incident plane S1 of the substrate 200 and a light focusing element on the color separation element. The color separation element may include a color filter. The color filter may include a red filter, a green filter, a blue filter, a cyan filter, a yellow filter, a magenta filter, a white filter, a black filter, and an IR cutoff filter. The light focusing element may include a digital lens or a hemispherical lens.

Figure 4:
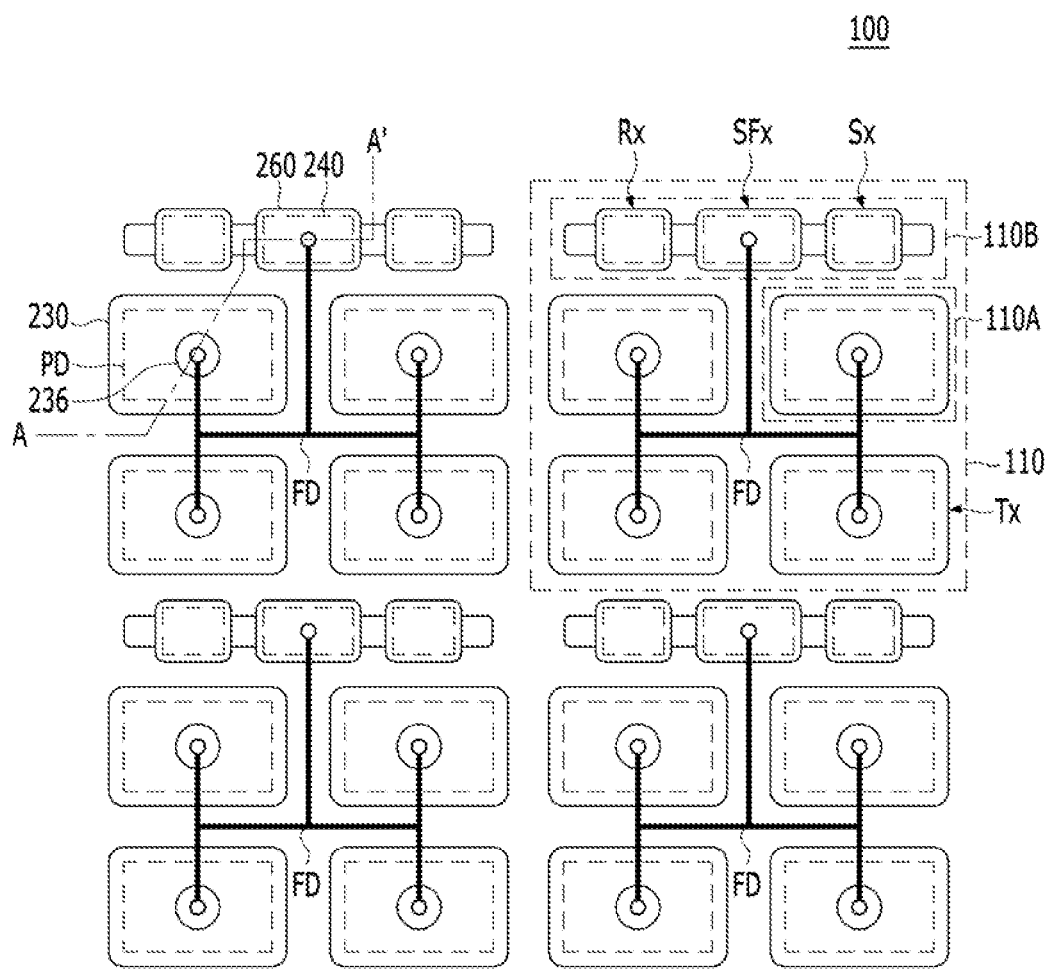
FIG. 4 is a plane view illustrating part of a pixel array of an image sensor in accordance with another embodiment of the present invention.

FIG. 4 is a plane view showing part of the pixel array of an image sensor in accordance with another embodiment of the present invention. FIG. 4 illustrates a case in which the unit pixels 110 of the image sensor in accordance with an embodiment described with reference to FIGS. 2 and 3 are applied to a shared pixel structure. Accordingly, a cross section taken along the line A-A' of FIG. 4 is the same as that of FIG. 3. Furthermore, the same reference numerals are used, and a detailed description of the same elements is omitted.

As shown in FIG. 4, each of the plurality of unit pixels 110 may include four light-receiving units 110A, each including the photoelectric conversion element PD and the transfer transistor Tx. Furthermore, each of the plurality of unit pixels 110 may include an output unit 110B, including the reset transistor Rx, the source follower transistor SFx, and the selection transistor Sx. The four light-receiving units 110A may share the single output unit 110B. As described above, the image sensor in accordance with an embodiment of the present invention can be easily applied to an image sensor having a shared pixel structure.

FIGS. 5A-5E are cross-sectional views taken along the line A-A' of FIG. 2 and illustrate a method for manufacturing an image sensor in accordance with an embodiment of the present invention.

Figure 5A:
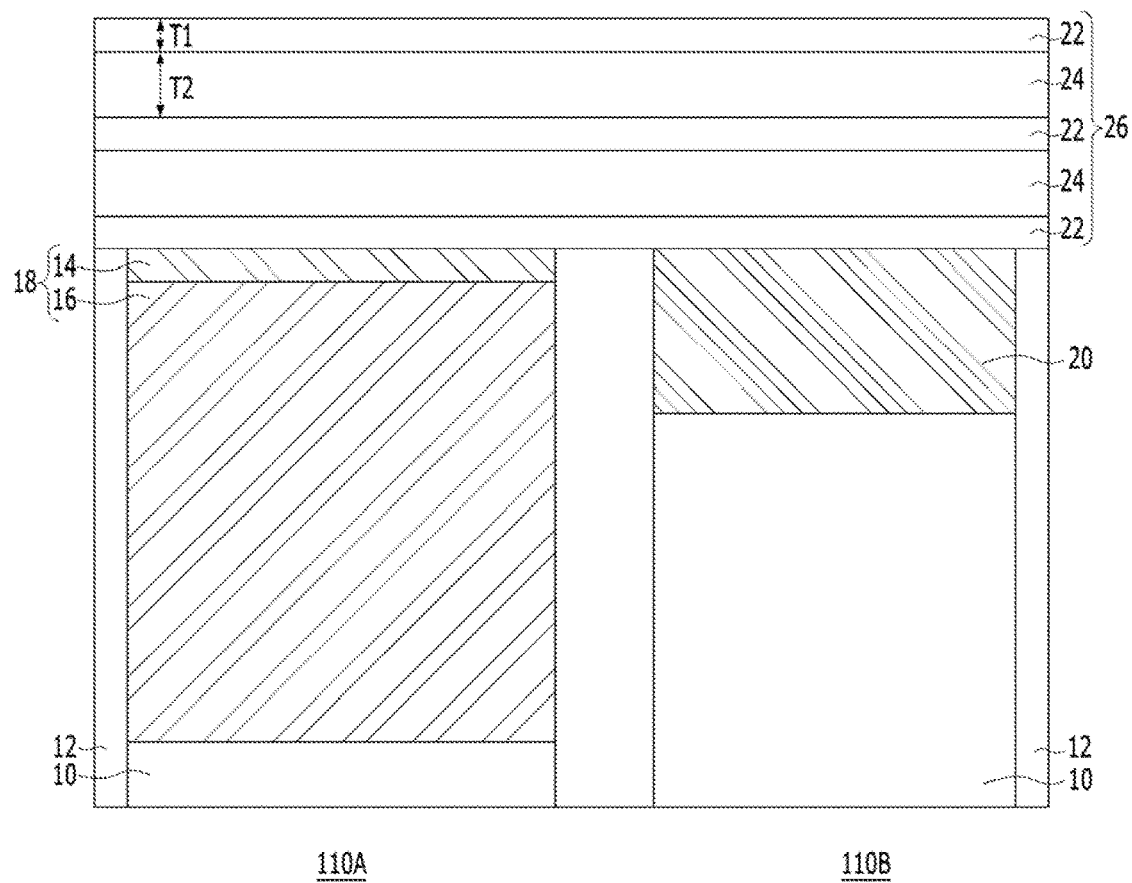
FIGS. 5A-5E are cross-sectional views taken along the line A-A' of FIG. 2 for manufacturing an image sensor in accordance with an embodiment of the present invention.

As shown in FIG. 5A, an isolation structure 12 is formed in a substrate 10 and divides the substrate 10 into the light-receiving unit 110A and the output unit 110B. An active region 10 may be formed in the output unit 110B by the isolation structure 12.

The substrate 10 may include a single crystal silicon-containing material. The isolation structure 12 may include a shallow trench isolation (STI), a deep trench isolation (DTI), or an impurity region. The isolation structure 12 may include any one of the STI, the DTI, and the impurity region or a combination of two or more of them.

A photoelectric conversion element 18 is formed in the light-receiving unit 110A, and a well 20 is formed in the active region. The photoelectric conversion element 18 may be formed of a photodiode. Specifically, the photoelectric conversion element 18 may have a first impurity region 14 which is formed by implanting or doping P type impurities into the substrate 10 and a second impurity region 16 which is formed by implanting or doping N type impurities into the substrate 10. The first impurity region 14 and the second impurity region 16 may be vertically stacked. Furthermore, the well 20 may be formed by implanting or doping P type impurities into the substrate 10. The P type impurities may be boron (B), and the N type impurities may be phosphorous (P) or arsenic (As).

Next, a multi-layer film 26, in which a first insulating layer 22 and a second insulating layer 24 are alternately stacked several times, is formed on the substrate 10. The first insulating layer 22 may include oxide, and the second insulating layer 24 may include nitride. The first insulating layer 22 may be disposed at the bottom layer and top layer of the multi-layer film 26. This is for preventing a stress caused by nitride forming on the second insulating layer 24. Furthermore, the thickness T2 of the second insulating layer 24 may be greater than the thickness T1 of the first insulating layer 22.

Figure 5B:
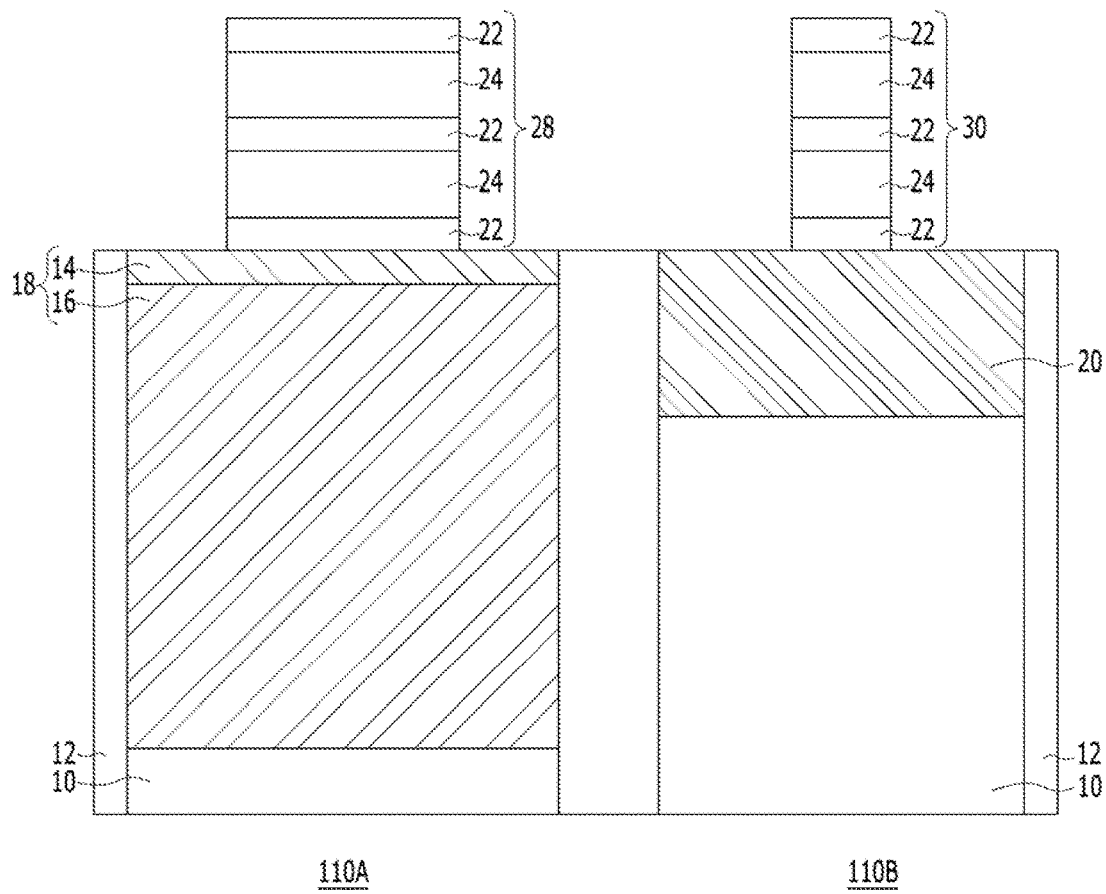

As shown in FIG. 5B, a first pillar 28 is formed on the photoelectric conversion element 18 and a second pillar 30 is formed on the well 20 by etching the multi-layer film 26 using a mask pattern (not shown) on the multi-layer film 26 as an etch barrier. The first pillar 28 and the second pillar 30 may have a vertical sidewall and have the same height.

Figure 5C:
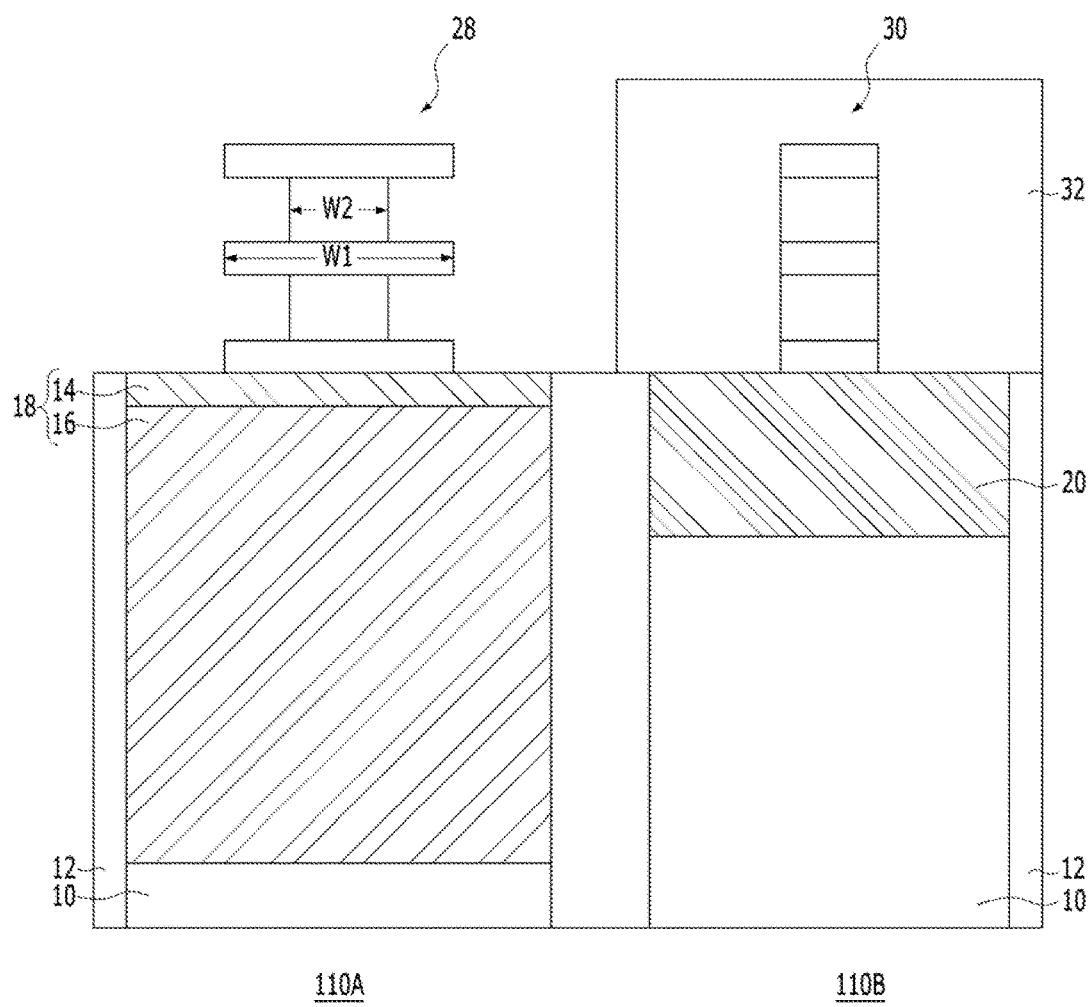

As shown in FIG. 5C, a mask pattern 32 that covers the second pillar 30 and exposes the first pillar 28 is formed over the substrate 10. Part of the second insulating layers 24 of the first pillar 28 is etched by performing a wet etch using the mask pattern 32 as an etch barrier. The wet etch may be performed using a phosphoric acid solution. As a result, the line width W2 of the second insulating layer 24 is smaller than the line width W1 of the first insulating layer 22 and a sidewall of the first pillar 28 has a concave-convex structure. When the wet etch is performed, a channel length may be different depending on how much the second insulating layer 24 is removed. That is, the channel length may change depending on a difference between the line width W1 of the first insulating layer 22 and the line width W2 of the second insulating layer 24.

In another embodiment, both of the sidewall of the first pillar 28 and the sidewall of the second pillar 30 may have the concave-convex structures. That is, channel lengths of both transistors may be adjusted through the aforementioned process.

Figure 5D:
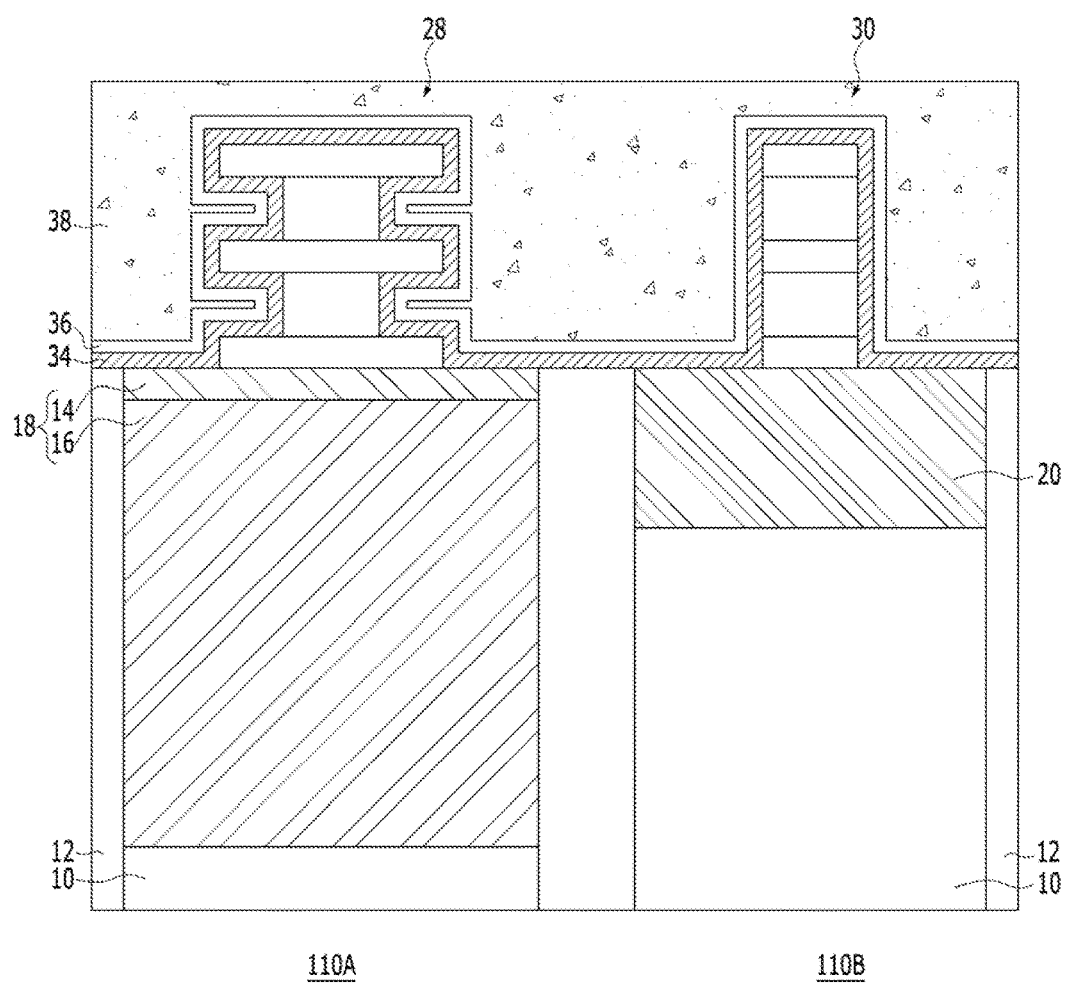

As shown in FIG. 5D, after the mask pattern 32 is removed, a reserved channel film 34 is formed on the entire surface of the resultant structure including the first pillar 28 and the second pillar 30. The reserved channel film 34 may include a silicon-containing material. For example, the reserved channel film 34 may include polysilicon, and the polysilicon may be undoped polysilicon into which impurities are not doped.

A gate insulating layer 36 and a gate conductive film 38 are sequentially formed on the reserved channel film 34. The gate insulating layer 36 may include oxide, nitride, oxynitride, or a combination thereof. The gate conductive film 38 may include a silicon-containing semiconductor material, metallic material, or a combination thereof.

An impurity doping process may be performed on the reserved channel film 34 before the gate insulating layer 36 is formed. For example, N type impurities may be doped into the reserved channel film 34 formed in the light-receiving unit 110A. P type impurities may be doped into the reserved channel film 34 formed in the output unit 110B.

Figure 5E:
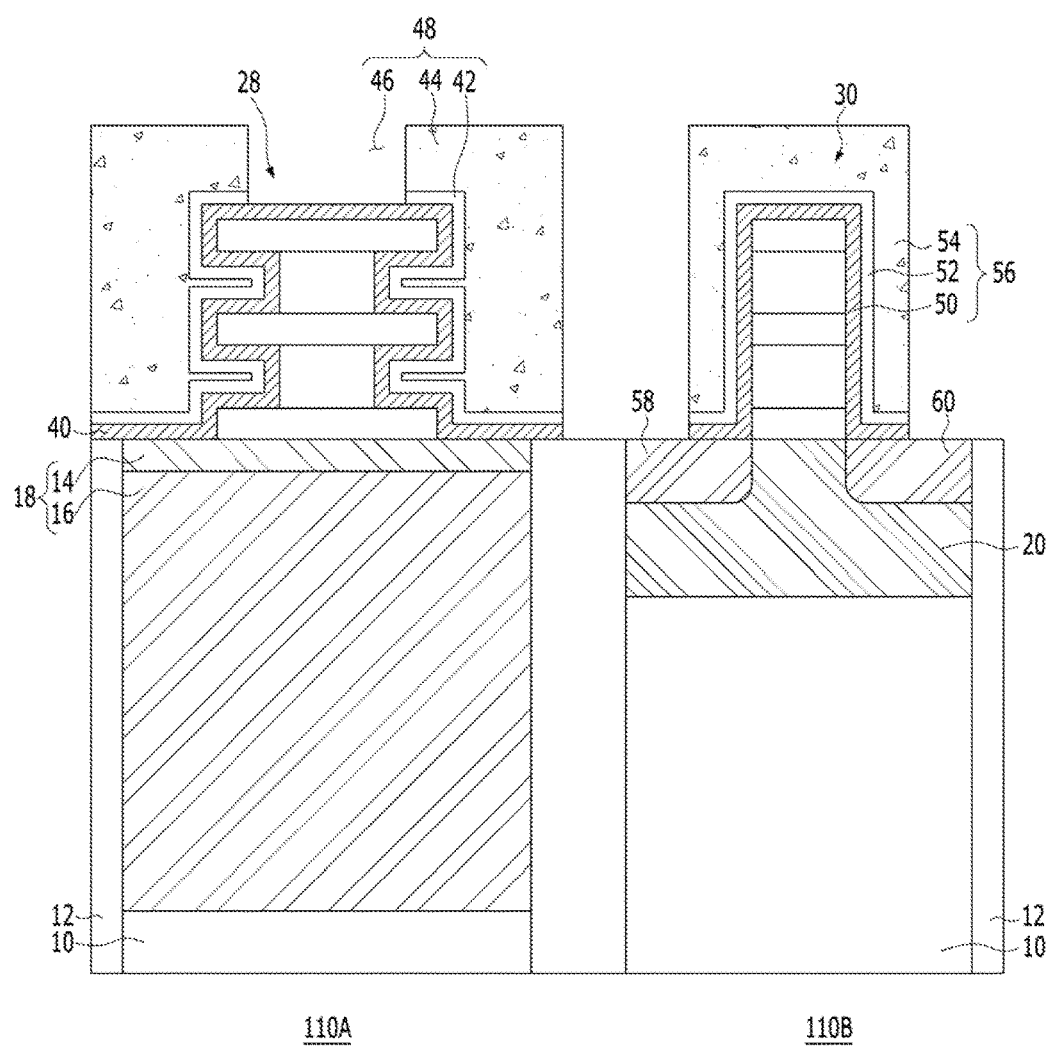

As shown in FIG. 5E, (i) a first gate 48 configured to cover the first pillar 28 and a first channel film 40 interposed between the first pillar 28 and the first gate 48 is formed in the light-receiving unit 110A and (ii) a second gate 56 configured to cover the second pillar 30 and a second channel film 50 interposed between the second pillar 30 and the second gate 56 is formed in the output unit 110B by selectively etching the gate conductive film 38, the gate insulating layer 36, and the reserved channel film 34. The first gate 48 may include a first gate insulating layer 42 and a first gate electrode 44, and the second gate 56 may include a second gate insulating layer 52 and a second gate electrode 54.

An open portion 46 configured to expose part of the first channel film 40 is formed in the first gate 48 by selectively etching the first gate insulating layer 42 and the first gate electrode 44.

Next, a source region 58 and a drain region 60 are formed by implanting or doping N type impurities into the active region, that is, the well 20, on both sides of the second pillar 30. In an embodiment, the source region 58 and the drain region 60 are formed after the second gate 56 is formed. However, in another embodiment, the source region 58 and the drain region 60 may be formed right after the first pillar 28 and the second pillar 30 are formed by performing the multi-layer film 26. Thereafter, the image sensor may be completed though a known fabrication method.

The image sensor in accordance with an embodiment of the present invention may be used in various electronic devices or systems. Hereafter, a camera including an image sensor in accordance with an embodiment of the present invention will be described with reference to FIG. 6.

Figure 6:
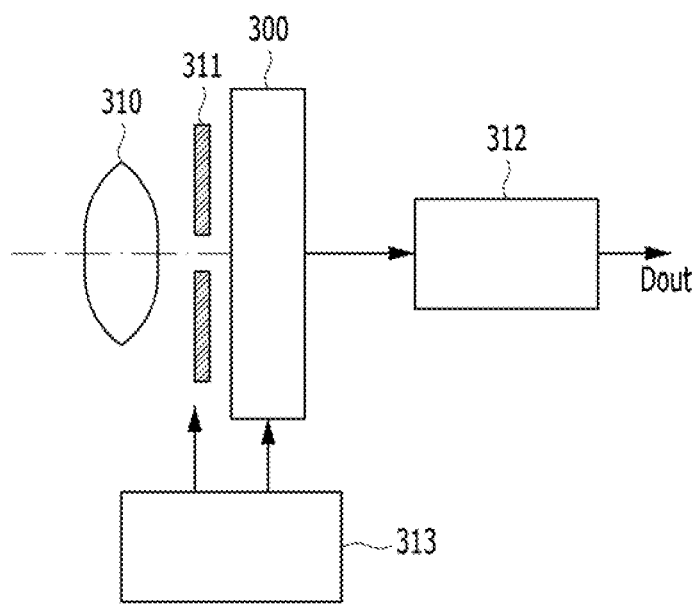
FIG. 6 is a diagram schematically illustrating an electronic device including an image sensor shown in FIG. 1.

FIG. 6 is a diagram schematically illustrating an electronic device including an image sensor shown in FIG. 1. Referring to FIG. 6, the electronic device including the image sensor in accordance with an embodiment of the present invention may be a camera capable of taking a still image or moving image. The electronic device may include an optical system or optical lens 410, a shutter unit 411, a driving unit 413 for controlling/driving the image sensor 400 and the shutter unit 411, and a signal processing unit 412.

The optical system 410 may guide light from an object to the pixel array 100 of the image sensor 400. The optical system 410 may include a plurality of optical lenses. The shutter unit 411 may control the light irradiation period and the light shield period for the image sensor 400. The driving unit 413 may control a transmission operation of the image sensor 400 and a shutter operation of the shutter unit 411. The signal processing unit 412 may process signals outputted from the image sensor 400 in various manners. The processed image signals Dout may be stored in a storage medium such as a memory or outputted to a monitor or the like.

As described above, in accordance with this technology, a high degree of integration is facilitated, the deterioration of a characteristic attributable to an increase of the degree of integration can be prevented, and the deterioration of a characteristic attributable to a short channel effect can be prevented. Furthermore, various channel lengths for transistors having different functions can be provided. Additionally, a dark current characteristic can be improved.

Although various embodiments have been described for illustrative purposes, it will be apparent to those skilled in the art that various changes and modifications may be made without departing from the spirit and scope of the invention as defined in the following claims.

What is claimed is:

1. An image sensor, comprising:
a substrate including a photoelectric conversion element;
a pillar formed over the photoelectric conversion element and having a concave-convex sidewall;
a channel film formed along a surface of the pillar and for having at least one end coupled to the photoelectric conversion element; and
a transfer gate formed over the channel film,
wherein the pillar comprises a stack structure in which a first insulating layer and a second insulating layer are alternately stacked N number of times, wherein N is a positive integer.

2. The image sensor of claim 1, wherein the first insulating layer and the second insulating layer have different etch selectivity from each other.

3. The image sensor of claim 1,
wherein an uppermost layer of the stack structure is formed of the first insulating layer, and
wherein a lowermost layer of the stack structure is formed of the first insulating layer.

4. The image sensor of claim 1, wherein a thickness of the second insulating layer is greater than a thickness of the first insulating layer.

5. The image sensor of claim 1, wherein a line width of the second insulating layer is smaller than a line width of the first insulating layer.

6. The image sensor of claim 1,
wherein the first insulating layer comprises oxide, and
wherein the second insulating layer comprises nitride.

7. The image sensor of claim 1, wherein the channel film comprises polysilicon.

8. The image sensor of claim 1, wherein the channel film comprises undoped polysilicon or P type polysilicon.

9. The image sensor of claim 1, wherein the channel film comprises N type polysilicon.

10. The image sensor of claim 1, further comprising:
an open portion formed in the transfer gate and exposing part of the channel film.

11. An image sensor, comprising:
an active region and a photoelectric conversion element provided in a substrate;
an isolation structure formed in the substrate and between the active region and the photoelectric conversion element;
a first pillar formed over the photoelectric conversion element and having a concave-convex sidewall;
a first channel film formed along a surface of the first pillar and for having at least one end coupled to the photoelectric conversion element;
a first gate formed over the first channel film;
a second pillar formed over the active region;
a source region and a drain region formed in the active region so that the second pillar is located between the source region and the drain region;
a second channel film formed along a surface of the second pillar and having ends on both sides of the second channel film coupled to the source region and the drain region, respectively; and
a second gate formed over the second channel film,
wherein each of the first pillar and the second pillar comprises a stack structure in which a first insulating layer and a second insulating layer are alternately stacked N number of times,
wherein N is a positive integer.

12. The image sensor of claim 11, wherein the first insulating layer and the second insulating layer have different etch selectivity from each other.

13. The image sensor of claim 11,
wherein an uppermost layer of the stack structure is formed of the first insulating layer, and wherein a lowermost layer of the stack structure is formed of the first insulating layer.

14. The image sensor of claim 11, wherein a thickness of the second insulating layer is greater than a thickness of the first insulating layer.

15. The image sensor of claim 11, wherein, in the stack structure of the first pillar, a line width of the second insulating layer is smaller than a line width of the first insulating layer.

16. The image sensor of claim 11, wherein the first insulating layer comprises oxide, and
wherein the second insulating layer comprises nitride.

17. The image sensor of claim 11, wherein the first pillar and the second pillar are the same as each other in vertical length.

18. The image sensor of claim 11, wherein the second pillar has a vertical sidewall.

19. The image sensor of claim 11, wherein the second pillar has a concave-convex sidewall.

20. The image sensor of claim 11, wherein each of the first channel film and the second channel film comprises polysilicon.

21. The image sensor of claim 11, wherein the first channel film comprises undoped polysilicon or P type polysilicon.

22. The image sensor of claim 11, wherein the first channel film comprises N type polysilicon.

23. The image sensor of claim 11, wherein the second channel film comprises P type polysilicon.

24. The image sensor of claim 11, further comprising:
an open portion formed in the first gate and exposing part of the first channel film.

25. The image sensor of claim 11,
wherein the first gate comprises a transfer gate, and
wherein the second gate comprises a reset gate, a source follower gate, or a selection gate.

26. A method for fabricating an image sensor, comprising:
forming a multi-layer film over a substrate, wherein the multi-layer film includes a first insulating layer and a second insulating layer which are alternately stacked N number of times, wherein a photoelectric conversion element is provided in the substrate and under the multi-layer film;
forming a pillar having a vertical sidewall by etching the multi-layer film;
patterning the second insulating layer so that the pillar has a concave-convex sidewall;
forming a channel film along a surface of the structure comprising the pillar; and
forming a transfer gate over the channel film.

27. The method of claim 26, further comprising:
forming an open portion in the transfer gate and exposing part of the channel film.

28. A method for fabricating an image sensor, comprising:
forming an active region and a photoelectric conversion element in a substrate;
forming an isolation structure in the substrate and between the active region and the photoelectric conversion element;
forming a multi-layer film over the substrate, wherein the multi-layer film includes a first insulating layer and a second insulating layer which are alternately stacked N number of times, wherein N is a positive integer;
etching the multi-layer film to form a first pillar and a second pillar over the photoelectric conversion element and the active region, respectively, wherein each of the first pillar and the second pillar has a vertical sidewall;
etching the second insulating layer in the first pillar so that the first pillar has a concave-convex sidewall;
forming a reserved channel film along a surface of a structure comprising the first pillar and the second pillar;
forming a gate insulating layer over the reserved channel film;
forming a gate conductive film over the gate insulating layer;
patterning the gate conductive film to form a first gate and a second gate, wherein the first gate is formed over the concave-convex sidewall of the first pillar, wherein the second gate is formed over the vertical sidewall of the second pillar;
patterning the reserved channel film to form a first channel film and a second channel film, wherein the first channel film is formed between the concave-convex sidewall of the first pillar and the first gate, wherein the second channel film is formed between the vertical sidewall of the second pillar and the second gate; and
patterning the gate insulating layer to form first and second gate insulating patterns, wherein the first gate insulating pattern is formed between the first channel film and the first gate, wherein the second gate insulating pattern is formed between the second channel film and the second gate.

29. The method of claim 28, further comprising:
forming an open portion in the first gate and exposing part of the first channel film.

30. The method of claim 28, further comprising:
doping first and second impurities into the reserved channel film formed over the photoelectric conversion element and the reserved channel film formed over the active region, respectively, after the forming of the reserved channel film.

* * * * *